Figure 1:
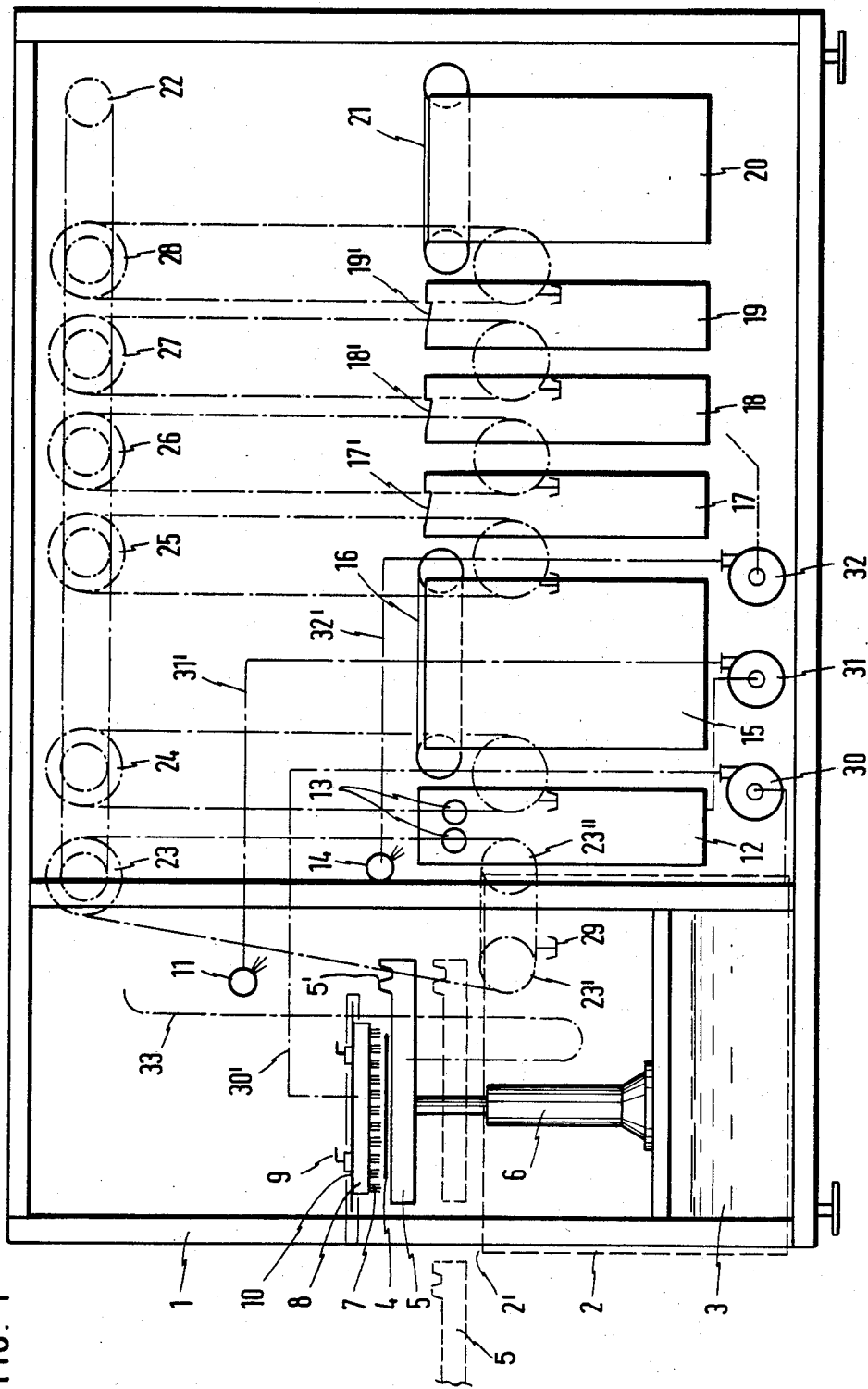

United States Patent [19]

Knollmann

[11] Patent Number: 4,542,968
[45] Date of Patent: Sep. 24, 1985

[54] DEVICE FOR TREATING PHOTO PRINTING PLATES

[76] Inventor: Fritz Knollmann, Meraner Strasse 9, D-8000 Müchen 90, Fed. Rep. of Germany

[21] Appl. No.: 562,972

[22] Filed: Dec. 19, 1983

[30] Foreign Application Priority Data

Dec. 28, 1982 [DE] Fed. Rep. of Germany ....... 3248411

[51] Int. Cl.$^4$ .............................................. G03D 3/10
[52] U.S. Cl. .................................... 354/322; 354/317; 134/76; 15/77
[58] Field of Search ............... 354/317, 319, 320, 321, 354/322, 325; 134/48, 76, 77, 133, 134; 15/77, 102

[56] References Cited

U.S. PATENT DOCUMENTS

| | | | |
|---|---|---|---|
| 2,555,874 | 6/1951 | Coughlin | 354/317 |
| 2,677,320 | 5/1954 | Coughlin | 354/317 |
| 3,382,520 | 5/1968 | Savart | 15/77 |
| 4,045,809 | 8/1977 | Landers | 354/322 |
| 4,208,119 | 6/1980 | Spence-Bate | 354/322 |
| 4,332,454 | 6/1982 | Hensel et al. | 354/317 |

Primary Examiner—A. A. Mathews
Attorney, Agent, or Firm—Paul L. Sjoquist

[57] ABSTRACT

In case of a device for treating flexible synthetic printing plates having a thickness of 2 to 7 mm with a depth of profile of 1 to 4 mm, including at least one washing-out step, a flushing step and a drying step, there are provided for the washing-out step an approximately horizontal table which is vertically adjustable, and for the aftertreatment steps containers in which the printing plates each can be perpendicularly suspended.

14 Claims, 5 Drawing Figures

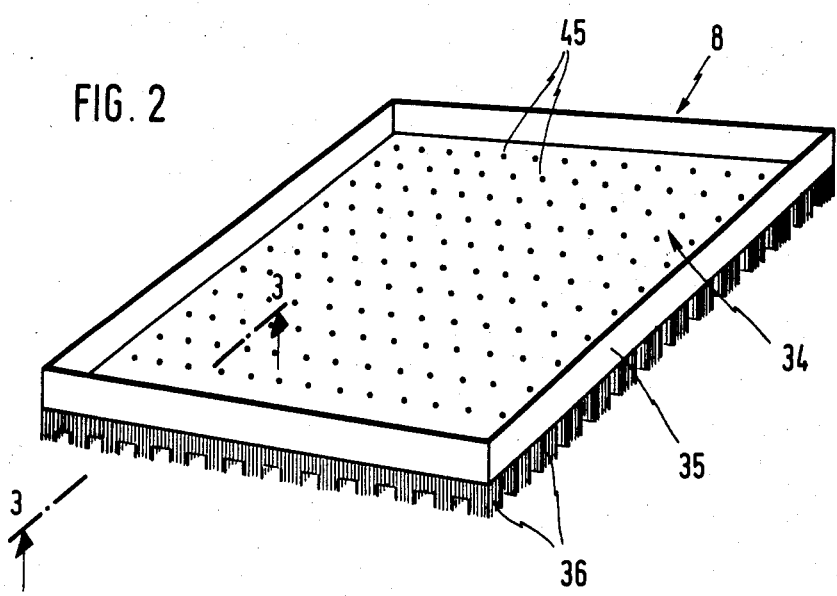
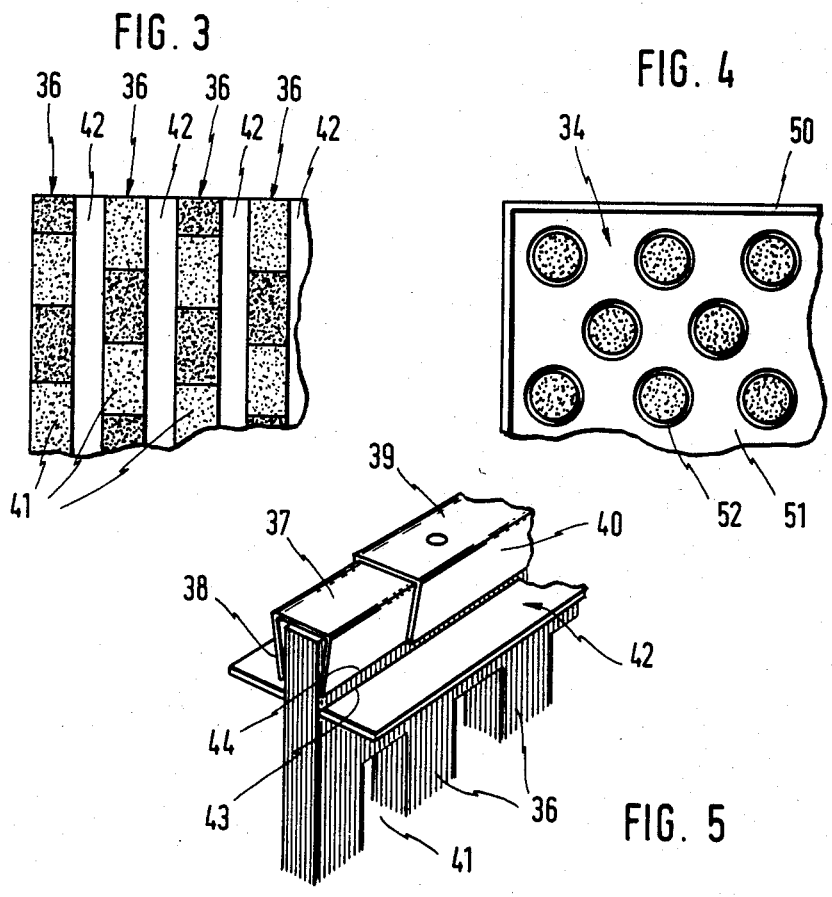

DEVICE FOR TREATING PHOTO PRINTING PLATES

This invention relates to a device for treating photo printing plates, particularly flexible synthetic material printing plates having a thickness of 2 to 7 mm with a depth of profile of 1 to 4 mm, including at least one washing-out step, one aftertreatment step and one drying step.

There are already existing a plurality of devices for treating photo printing plates, including those which operate fully automatically. For example, there are treated particularly thin photo printing plates made of synthetic material having an overall thickness of maximally 1.5 mm in systems in which the photo printing plates in horizontal position are conveyed from one treatment station to another treatment station; during this process, the photo printing plates are being washed out from below or from above by means of spraying nozzles or also by means of brush aggregates or of plates covered with plush. If however there are used thicker flexible photo printing plates, i.e. so-called flexo-plates, up to now a fully automatic treatment from the untreated dry condition to the final dry condition has failed alone for the reason that the washing-out process is particularly short with regard to the drying process.

Since usually a time of from 3 to 5 minutes has to be determined for the washing-out step, whereas the drying time can be from six times to ten times longer, such flexo-plates, it is true, have been fully automatically treated within one washing step, but the printing plate put in manually has been taken out after the washing process again manually and introduced or suspended in a drying system.

This invention has been based on the problem in case of a device of the initially indicated type to provide a possibility to treat the especially flexible and thick photo printing plate, usually made of synthetic material, in a fully automatic way with regard to all the treatment steps and to provide a system whose overall length is particularly compact.

This problem has been solved by the invention by providing for the washing-out step an approximately horizontal table which can be vertically adjusted and for the aftertreatment steps containers in which the printing plates each can be suspended perpendicularly.

It is due to the perpendicular suspension of the printing plates that there is required for the aftertreatment, after washing-out, just as much space as is necessary for the aftertreatment containers containing the correspondingly suspended printing plates. It is possible in this way to shorten the overall length of the whole system, in comparison with a fully automatic system with horizontally placed and horizontally conveyed printing plates, to about a third.

The printing plate can on one side, preferably the transverse side, be provided with a suspension device, e.g. suspension bar, and at all the conveyors which are in the form of chain drives and if necessary in pairs there can be provided tappets or the like. It is in this way possible to control introducing and carrying out of the individual printing plates in a simple manner in dependence on the treatment time, especially since the chain drives are constructed such that in the region ascending in chain moving direction they lift the individual printing plates from the preceding treatment step and in the descending region lower them in the following treatment step. The chain drives can have synthetic material belts having an internal toothing; synthetic material belts are in this case especially suitable since they unlike metallic chains are substantially neutral relative to chemical attacks. There can be attached to the chain drives, which are arranged vertically side-by-side and are self-contained, a differing number of tappets or the like. By selecting the number of the tappets, one can indirectly exert an influence on the intermittent advance of the printing plates from the one treatment station to the other treatment station.

The aftertreatment containers are usefully of different lengths for receiving a different number of printing plates.

Since in particular the drying process of the relatively thick flexo-plates takes up approximately six times to ten times the period of time required for the washing-out process, the drying containers (one can also provide two such containers) can have a length that for example six to ten plates can be dried simultaneously in one drying container. It is possible in this way to adjust the cycle of the system for example to the time necessary for the washing-out process, e.g. five minutes; since in this case the drying process would take about to read forty minutes, the drying containers are constructed so that at least they can receive eight printing plates.

According to a further modified embodiment of the invention, all the chain drives, which in case of need are each provided with a magnetic coupling, are synchronously connected and have a common drive.

The couplings in this case can be e.g. magnetic couplings which can be controlled correspondingly from the switch desk and consequently the actuation of the individual separate chain drive depends on the actuation of the respective magnetic coupling.

Particularly the drying containers can be provided with horizontal conveyors so as to guarantee that more than one printing plate can be contained in the respective aftertreatment container.

For transversely transporting the printing plates from the region of the one chain drive to the region of the following chain drive, the edges of the aftertreatment containers can be provided with ramps for horizontally moving the printing plates; the chain drives can also separately or additionally be provided, in the moving direction behind the tappets or the like, with wedges or the like, for horizontal movement of the printing plates.

It is possible that in particular for the fully automatic device, but not only for such a device, one can provide a brush aggregate for washing out the printing plates, in which aggregate inventively the brushes in case of need in the form of flat brushes made of natural bristles or synthetic material bristles are attached to a perforated bottom of a tray or protrude therefrom; the tray can be adapted to be oscillated by a crank drive, for example.

There is usefully provided, at a distance from the perforated bottom, at least one cover which leaves exposed the brushes and extends parallel to the perforated bottom. Since the solvent or washing agent for the printing plates drop through the holes in the perforated bottom, part of the washing liquid or of the solvent would drop through in the spaces between the brushes, and the brushes would not be sufficiently soaked. The cover makes it possible for the solvent to penetrate over the edges of the cover into the bristles so that same are at any time sufficiently wet through. This is relevant especially because the solvent used in connection with the dissolved polymer material desiccates relatively rapidly and would render the brush aggregate unserviceable. A special treatment of the brush aggregate when it is in its inoperative position will hereinafter be described in more detail.

According to an embodiment having possibly individual brushes which are arranged out-of-line, the cover is usefully a perforated plate having openings for the brushes. However, the brushes can also be in the form of strip brushes which are arranged parallel to one another, and the cover can be in the form of covering strips arranged in the interspaces. In this case, the strip brushes have preferably cut-out portions so that they are meander-shaped, and the covering strips are preferably arranged approximately at the level of the shortened brush portions.

THe drawing shows exemplifying embodiments of the invention which hereinafter will be described in more detail; it is shown in FIG. 1 a strongly schmematisized longitudinal section of an embodiment of the whole device, FIG. 2 an oblique view on a detail of this embodiment, FIG. 3 a partial section along line 3—3 in FIG. 2, FIG. 4 a similar partial section through a modified embodiment, and FIG. 5 on a strongly enlarged scale, a detail of the embodiment as shown in FIG. 2.

Within a frame 1, which is rectangular in longitudinal section as well as in cross section, there are accomodated all the treatment steps for a photo printing plate, particularly for a flexo printing plate; these steps are hereinafter described in connection with details of the fully automatic apparatus. The frame 1, which when in use is naturally substantially covered at its walls, has at its front side (left side of the drawing) an insertion opening for the photo polymer plate, e.g. flexo printing plate. This insertion is performed outside of the frame by putting the photo printing plate 4 upon a horizontally movable table 5 such that the printing plate at its transverse side facing towards the system is mechanically secured to table 5, which has a suspension bar 5'.

When the lifting table is returned into its final position, which is not shown, the lifting table 5 is lifted to the shown position by the actuation of a compressed-air piston or hydraulic piston 6. The printing plate is in its shown position pressed-on by means of mechanical means or by a vacuum, and it can, as shown, be washed out during the washing-out step by means of a flat brush aggregate 7 which hereinafter will be described in more detail.

The solvent, e.g. perchlorethylene, provided in the distributing tray 8 flows through the perforated bottom, which will hereinafter be described in more detail, to the individual brushes; the distributing tray is caused by a crank drive 9 to oscillate horizontally thereby to achieve the effect that the brushes with the solvent in fact form uniformly all around the points provided in the printing relief.

This aftertreatment of the brush aggregate can be necessary since the e.g. above mentioned solvents together with the polymer remainders harden quite rapidly and would render the brush aggregate unserviceable; in the inoperative position of the system, the brush aggregate is also held in the dipping or it is at least washed out sufficiently to allow the brush aggregate to remain dry.

In a tray 2, whose upper edge 2' extends approximately as far as to the height of the lifting table 5 in the lowest position of the latter, the solvent 3, e.g. perchlorethylene, is collected which during washing-out drops laterally from the lifting table 5.

Above the table, but still within the washing-out step, there is provided an after-spraying tube 11 extending transversely to the drawing plane, by means of which the printing plates 4 which have been washed-out are sprayed. The advancing or conveying of the individual printing plates will be described in more detail hereinafter. The printing plates 4 and tables 5 now hanging perpendicularly on their suspension bars 5' are in this position carried to the other treatment steps.

There is provided in the represented embodiment a reflush container 12 to which the printing plates 4 are carried via two brush rolls 13. In addition, a further afterspraying tube 14, which also extends transversely to the drawing plane, serves for further cleaning of the printing plates possibly having on them still small remainders of polymer.

After termination of the treatment in the reflush container 12, in which only one printing plate is put at a time, the printing plates 4 are suspended in a drying container 15 which is provided with a horizontal conveyor in the form of a transport belt 16. Since drying of the photo polymer plates takes at least four to five times, usually six to seven times, the time used for washing-out, the drying container is long enough to allow successive suspension of five to six or even more photo polymer plates which are according to the cycle moved in the same cycle rhythm in which feeding of the untreated printing plates 4 and the washing-out takes place.

After the drying container 15, there is arranged a container 17 for chemicals which again is capable of containing only a single printing plate. The container 17 has ramp surface 17' at its two upper edges facing each other so that the printing plate placed in the containers slides forwardly from its left suspension position to a position which is further to the right so that it can be seized by the following chain drive.

In a furthermore provided neutralization container 18, there are provided respective ramp surfaces 18'. This treatment step is followed by a treatment in a washing container 19 which has also a ramp surface 19'.

As a final step, there is in the present case again provided a drying container 20 which is also capable of containing several, e.g. five to ten, polymer plates at the same time, which according to the cycle are advanced by means of a transport belt 21.

From the last position the printing plate has reached in the drying container 20, then the printing plates, which now are dry, are removed by hand.

Advancing of the printing plates from one treatment step to the other treatment step is carried out by perpendicularly arranged, self-contained chain drives which are provided at the two longitudinal walls within the side walls of the treatment containers. All the chain drives are actuated by a central drive 22; there is provided for each chain drive a magnetic oupling, which is not shown, whereby it is not only possible from a switch desk to adjust the cycle rhythm and control the system as a whole, but there is also the possibility from the switch desk to influence the fully automatic operation by actuating or stopping the individual chain drives.

The chain drive 23 provided for the transport of the printing plates from the horizontal position to the perpendicular position at its lower end runs over two chain wheels 23', 23" so that its lifting phase is in oblique direction. The printing plates each are grasped by a suspension holder or tappet 29 laterally at the suspension bars and while being lifted, as already mentioned, led past an after-spraying tube 11. During the ascending phase (chain 24) there is again performed a spraying by means of the respraying tube 14, after the printing plate has been treated, between the two brush rolls 13.

By means of the tapped having the same construction as the tappet 29 at the chain drive 24 whose two chain wheels are arranged perpendicularly one below the other and have the same size, the printing plate, which is suspended in the container 12, is grasped, lifted and laid down in the drying container 15. When a transverse transport has been carried out by means of the transport belt 16, the printing plate is again grasped by the chain drive 25 and put down in the treatment container 17; the ramp surfaces 17' cause the printing plate, which has been put down and suspended, to slide in advance direction forwardly so that the chain drive 26, when the treatment in the container 17 has been terminated, can again grasp the printing plate and table 5.

Thereafter, the printing plate is conveyed on in the cycle rhythm over the chain drives 26, 27 and 28 to the drying container 20 in the same manner.

It has also to be noted that wedges can be attached in rotational direction behind the tappets to the individual chains, which e.g. consist of a synthetic belt having an inner toothing, so that when the individual printing plate has been laid down in the container, a transverse movement of said printing plate in the direction to the grasping region of the following chain drive is made possible.

A pump 30 transports the solvent from the tray 2 through a conduct 30' to the distributing tray 8.

A pump 31 transports the reflush liquid from an overflow pipe (not shown) of the reflush container 12 to the respraying tube 11 through a conduct 31'.

A pump 32 transports pure solvent, i.e. for example perchlorethylene, from a store tank (not shown) to the respraying tube 14 through a conduct 32'.

If it is intended to retain the respective printing plate on the lifting table not mechanically but by means of a vacuum, this vacuum can lead via a vacuum tubing 33 to an evacuating device.

The surface pressure which is exerted by the piston 6 on the individual printing plates can be adjusted such that it is adapted to the size of the printing plates. The greater is the depth the brushes work into the relief of of the photo polymer plate, the higher rises the latter since the pressure in the piston 6 remains equal and is not moved to the final position.

In FIG. 2, the distributing tray 8 is represented on a strongly enlarged scale; it has a perforated bottom 34 and side walls 35 extending rectangularly to each other.

According to the embodiment shown in FIGS. 1, 3 and 5, there are attached to the perforated bottom strip brushes 36 which are held in a U-bar 37 which has two legs 38 which each are converging, thereby compressing the individual natural bristles.

For attaching the strip brushes to the perforated bottom, there are fastened to the latter U-shaped clamps 39 whose resilient legs 40 embrace the U-shaped holding means 37 for the bristles at positions spaced from each other.

The strip brushes 36 have cutouts 41 each of which is spaced from the other one so that a meander-shaped longitudinal section is resulting.

In the interspaces between two holding means 37, there are mounted strips 42, made e.g. of special steel, so that their distance from the perforated bottom 34 is such that the upper edge 43 of said strips extends about two millimeters below the edge of the holding means 37. These strips collect the solvent coming through the holes 45 of the perforated bottom 34, and thereafter the solvent flows to the bristles so that the ends of the bristles are wetted. It is in this manner not only possible to uniformly wet through the flat brushes or strip brushes 36, but the brush aggregate is also substantially prevented from being "dried-out". The cutouts 41 are provided also for preventing the bristles from supporting themselves one against the other in longitudinal direction of the strip brush, whereby the effect of the brushes would be reduced. Even if it is possible without more ado to use a brush aggregate which is in the form of a plate brush, in case of which, however, there might occur difficulties when the roots of the individual bristles are to be uniformly wet through, in case of the embodiment as shown in FIG. 4, there is mounted at the perforated bottom 34 a brush aggregate which consists of individual pencillate brushes 50 arranged out-of-line to each other, as shown. In this case, there is provided, instead of the metal sheet strip 42, a perforated plate 51 which is fastened a corresponding distance from the perforated bottom 34 and has openings 52 for the individual brushes to be put through.

It has to be mentioned that the lifting table 5, when the printing plate which has been washed out has been pulled away by means of the chain drive 23, can be sprayed on its surface with a fresh solvent.

The solvent contained in the tray 2 can be held at a constant bath level by means of an overflow pipe which has not been shown but has been mentioned. The solvent flowing off can either be supplied to a store container placed below the table board (said store container is not shown), or it can be used for respraying during removing from the table board.

I claim:

1. An apparatus for treating photo printing plates comprising a table having a horizontal first position for receiving a printing plate, said table having a transverse suspension bar, means for vertically raising said table and said printing plate to a second horizontal position; a washing brush and tray mounted adjacent said table second horizontal position; a continuously moving conveyor having suspension holders for grasping said suspension bars, said conveyor having a path of movement adjacent said printing plate and table, whereby a suspension holder grasps a suspension bar in said table first position; and a plurality of treatment containers positioned along the path of movement of said conveyor whereby said printing plates and said tables may be suspended into each of said containers during movement of said conveyor.

2. The apparatus of claim 1, wherein said conveyor further comprises at least one endless loop chain drive.

3. The apparatus of claim 2, wherein said endless loop chain drive further comprises a toothed belt constructed from synthetic material.

4. The apparatus of claim 1, wherein said conveyor further comprises at least a pair of endless loop chain drives in parallel alignment.

5. The apparatus of claim 1, further comprising at least two treatment containers having respective different length dimensions along the path of movement of said conveyor.

6. The apparatus of claim 21, further comprising at least one treatment container having a length dimension sufficient to simultaneously contain at least five of said photo printing plates and tables.

7. The apparatus of claim 22, wherein said conveyor further comprises a conveyor portion horizontally positioned over said treatment container having a length dimension sufficient to simultaneously contain at least five of said photo printing plates and tables.

8. The apparatus of claim 17, wherein said washing brush and tray further comprise a perforated tray having brush portions protruding through the perforations in said tray.

9. The apparatus of claim 8, further comprising means for oscillating said tray in a horizontal plane.

10. The apparatus of claim 8, further comprising a cover spaced from and parallel to said perforated tray, said cover having perforations therethrough, and said brush portions protruding through said perforations.

11. The apparatus of claim 8, wherein said brush portions further comprise a plurality of brush groups arranged in nonaligned rows and columns.

12. The apparatus of claim 8, wherein said brush portions further comprise a plurality of brush strips arranged in parallel alignment.

13. The apparatus of claim 12, wherein said brush strips are of varying lengths.

14. The apparatus of claim 13, further comprising a cover spaced from and parallel to said perforated tray, said cover having perforations therethrough and all of said brush strips protruding through said perforations.

* * * * *

UNITED STATES PATENT AND TRADEMARK OFFICE
CERTIFICATE OF CORRECTION

PATENT NO.  : 4,542,968

DATED       : September 24, 1985

INVENTOR(S) : Fritz Knollmann

It is certified that error appears in the above-identified patent and that said Letters Patent is hereby corrected as shown below:

In column 3, line 16, "THe" should be -- The --.
In column 5, line 8, "tapped" should be -- tappet --.
In claim 6, column 7, line 1, "21" should be -- 5 --; claim 7, column 7, line 5, "22" should be -- 6 --; claim 8, column 7, line 11, "17" should be -- 1 --.

Signed and Sealed this

Seventeenth Day of December 1985

[SEAL]

Attest:

DONALD J. QUIGG

Attesting Officer

Commissioner of Patents and Trademarks